(12) United States Patent
Kato et al.

(10) Patent No.: US 10,862,409 B2
(45) Date of Patent: Dec. 8, 2020

(54) MOTOR DEVICE, BLOWING DEVICE, AND SERVER DEVICE

(71) Applicant: Nidec Corporation, Kyoto (JP)

(72) Inventors: Masayuki Kato, Kyoto (JP);
Tomotsugu Sugiyama, Kyoto (JP);
Guifeng Zhang, Kyoto (JP); Takayuki Kinouchi, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 122 days.

(21) Appl. No.: 16/268,522

(22) Filed: Feb. 6, 2019

(65) Prior Publication Data

US 2019/0267917 A1     Aug. 29, 2019

(30) Foreign Application Priority Data

Feb. 23, 2018   (JP) .................... 2018-031070

(51) Int. Cl.
*H02P 5/48* (2016.01)
*F04D 27/00* (2006.01)
*F04D 25/06* (2006.01)
*H05K 7/20* (2006.01)
*G05B 19/042* (2006.01)
*H02P 6/16* (2016.01)

(52) U.S. Cl.
CPC .......... *H02P 5/48* (2013.01); *F04D 25/06* (2013.01); *F04D 27/004* (2013.01); *G05B 19/042* (2013.01); *H05K 7/20172* (2013.01); *H05K 7/20209* (2013.01); *H05K 7/20718* (2013.01); *H05K 7/20836* (2013.01); *G05B 2219/25053* (2013.01); *H02P 6/16* (2013.01)

(58) Field of Classification Search
CPC ...... H02P 5/48; H02P 1/00; H02P 1/04; H02P 1/46; H02P 3/00; H02P 3/12; H02P 4/00; H02P 5/00; H02P 7/00; H02P 8/00; H02P 1/26; H02P 1/42; H02P 21/00; H02P 23/00; H02P 27/00; H02P 27/04; H02P 27/06; H02P 9/00; H02P 27/08; F04D 27/004; F04D 25/06; H05K 7/20172; H05K 7/20836; H05K 7/20209; H05K 7/20718; G05B 2219/25053; G05B 19/042

See application file for complete search history.

(56) References Cited

U.S. PATENT DOCUMENTS 8,351,824 B2 * 1/2013 Maeda ............... G03G 15/0121
399/167
8,866,418 B2  10/2014 Keller et al.
2007/0285045 A1 * 12/2007 Franz ..................... D21G 1/00
318/799

FOREIGN PATENT DOCUMENTS

JP    2005-278278 A    10/2005
JP    2005-278363 A    10/2005

* cited by examiner

*Primary Examiner* — Antony M Paul
(74) *Attorney, Agent, or Firm* — Keating & Bennett

(57) ABSTRACT

A motor device includes motors, detector in the respective motors to detect motor rotational speeds, and an output controller configured or programmed to output a single output rotational speed based on the motor rotational speeds input from the detectors. The output controller multiplies at least one of the input motor rotational speeds by a coefficient derived based on target rotational speeds of the motors to calculate a conversion value, and determines the output rotational speed.

15 Claims, 5 Drawing Sheets

| Duty | TRS1(rpm) | TRS2(rpm) |
|---|---|---|
| 20% | 2000 | 1000 |
| 40% | 4000 | 2000 |
| ⋮ | ⋮ | ⋮ |

FIG. 2

MOTOR DEVICE, BLOWING DEVICE, AND SERVER DEVICE

CROSS REFERENCE TO RELATED APPLICATIONS

This application claims the benefit of priority to Japanese Patent Application No. 2018-031070 filed on Feb. 23, 2018. The entire contents of this application are hereby incorporated herein by reference.

BACKGROUND OF THE INVENTION

1. Field of the Invention

The present disclosure relates to a motor device, a blowing device, and a server device.

2. Description of the Related Art

A motor control device can easily synchronize and accurately control rotations of a plurality of small motors. The motor control device includes motors, rotation detectors, counting sections, difference calculating sections, modulated-pulse generating sections, and driving sections.

The rotation detectors generate pulses according to the rotations of the respective motors and detect the rotations of the motors. The counting sections count two or more pieces of rotational speed data concerning the motors based on the pulses respectively generated by the rotation detectors. The difference calculating sections calculate rotational speed differences of the respective motors from target rotational speeds based on the two or more pieces of rotational speed data counted by the counting sections. The modulated-pulse generating sections generate pulses having pulse widths modulated based on the rotational speed differences calculated by the difference calculating sections. The driving sections drive the respective motors based on the pulses generated by the modulated-pulse generating sections.

In the conventional configuration, two or more pieces of rotational speed data of the motors is necessary in order to control the motors. In other words, it is necessary to output two or more pieces of rotational speed data to a control device that controls the motors. For example, when control device has only one input terminal for inputting the rotational data, the control device has difficulty appropriately controlling the motors due to a difficulty in detecting rotational speed abnormalities of the motors.

SUMMARY OF THE INVENTION

A motor device according to an illustrative embodiment of the present disclosure includes a plurality of motors, a plurality of detectors provided in the respective motors to detect motor rotational speeds; and an output controller configured or programmed to output single output rotational speed based on the motor rotational speeds input from the detectors. The output controller multiplies at least one of the input motor rotational speeds by a coefficient derived based on target rotational speeds of the motors to calculate a conversion value, and determines the output rotational speed.

The above and other elements, features, steps, characteristics and advantages of the present disclosure will become more apparent from the following detailed description of the preferred embodiments with reference to the attached drawings.

BRIEF DESCRIPTION OF THE DRAWINGS

FIG. 2 is a schematic diagram showing a data example stored in a storing section according to an illustrative embodiment of the present disclosure.

DETAILED DESCRIPTION OF THE PREFERRED EMBODIMENTS

Figure 4:
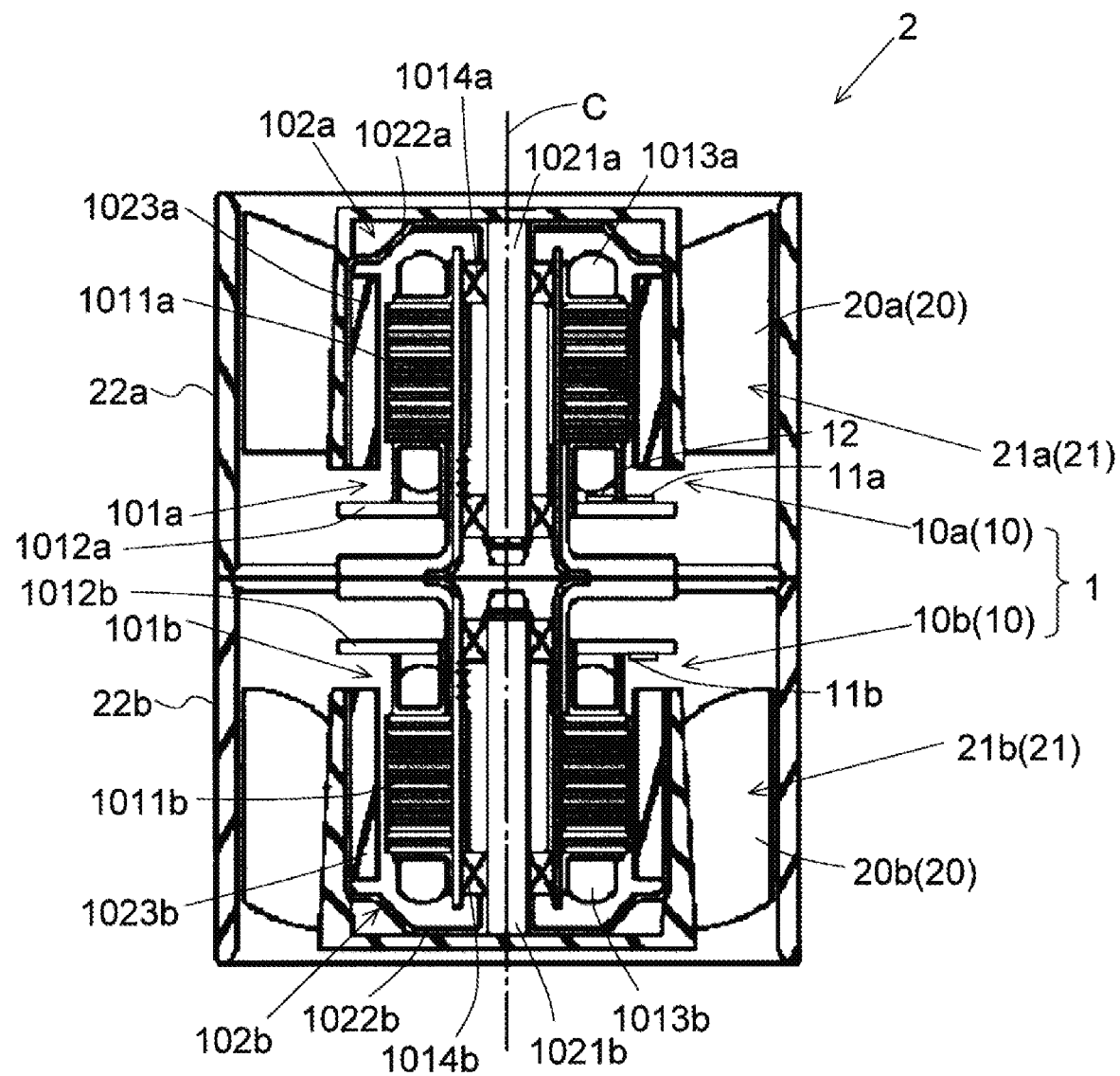
FIG. 4 is a schematic sectional view of a blowing device according to an illustrative embodiment of the present disclosure taken along a plane including a center axis.

An illustrative embodiment of the present disclosure is explained in detail below with reference to the drawings. In this specification, a direction parallel to a center axis C of a blowing device 2 shown in FIG. 4 is referred to as "axial direction", a direction orthogonal to the center axis C is referred to as "radial direction", and a direction along an arc centering on the center axis C is referred to as "circumferential direction". In this specification, the axial direction is assumed to be an up-down direction and a first motor 10*a* shown in FIG. 4 is assumed to be on the upper side with respect to a second motor 10*b* to explain shapes and positional relations of sections. However, this definition of the up-down direction does not intend to limit a direction during use.

Figure 1:
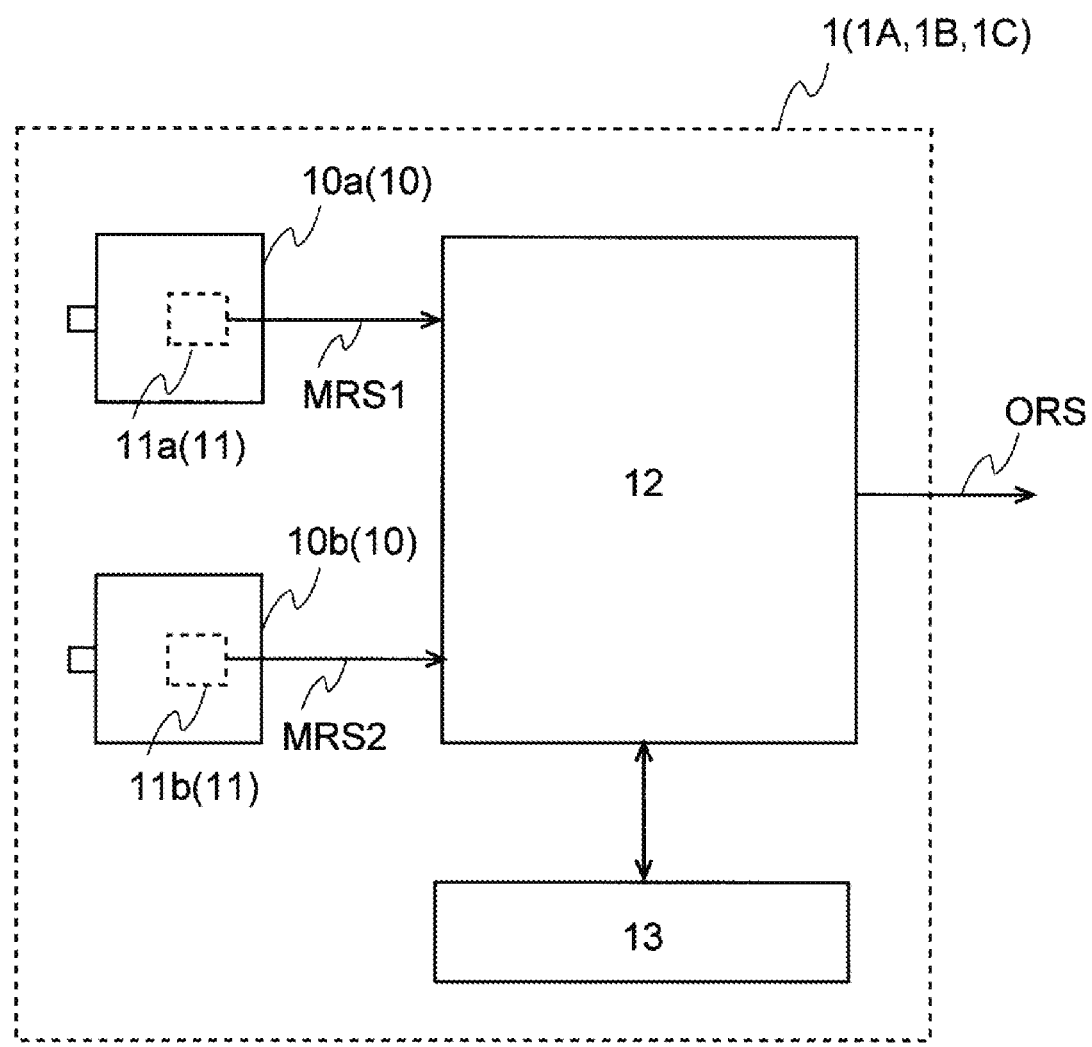
FIG. 1 is a schematic diagram showing the configuration of a motor device according to an illustrative embodiment of the present disclosure.

FIG. 1 is a schematic diagram showing the configuration of a motor device 1 according to the embodiment of the present disclosure. As shown in FIG. 1, the motor device 1 includes a plurality of motors 10. In this embodiment, the motor device 1 includes a first motor 10*a* and a second motor 10*b*. That is, the motor device 1 includes two motors 10. However, the motor device 1 may include three or more motors.

The motor device 1 includes a plurality of detecting sections 11 and an output control section 12. The motor device 1 further includes a storing section 13.

The detecting sections 11 are provided in the motors 10 and detect motor rotational speeds. The motor rotational speeds are measured values of rotational speeds of the motors 10. Each detecting section 11 only has to be capable of detecting the rotational speed of the motor 10. The configuration of the detecting section 11 is not particularly limited. The detecting section 11 may be configured by, for example, a Hall IC (Integrated Circuit) including a Hall element or an encoder including a light emitting element and a light receiving element.

In this embodiment, a first detecting section 11*a* is provided in the first motor 10*a* and a second detecting section 11*b* is provided in the second motor 10*b*. The number of the detecting sections 11 is the same as the number of the motors 10. When the number of the motors 10 is three or more, the number of the detecting sections 11 is also three or more. The first detecting section 11*a* detects first motor rotational speed MRS1, which is motor rotational speed of the first motor 10*a*. The second detecting section 11*b* detects second motor rotational speed MRS2, which is motor rotational speed of the second motor 10*b*.

The output control section 12 outputs single output rotational speed ORS based on the motor rotational speeds input from the detecting sections 11. In this embodiment, the output rotational speed ORS is a measured value itself in some cases and is a value calculated by a predetermined arithmetic operation based on the measured value in other cases.

The output control section 12 can be configured by a microcomputer including a CPU (Central Processing Unit), a ROM (Read Only Memory), a RAM (Random Access Memory), and input and output ports. Functions of the output control section 12 are realized by the CPU executing computer programs stored in the ROM or the like. All or a part of the functions explained as being realized in a software manner by the execution of the computer programs may be realized by an electric hardware circuit. Examples of the electric hardware circuit include an ASIC (Application Specific Integrated Circuit) and an FPGA (Field Programmable Gate Array).

In this embodiment, as shown in FIG. 1, the first motor rotational speed MRS1 and the second motor rotational speed MRS2 are input to the output control section 12. Although the two motor rotational speeds are input to the output control section 12, the output control section 12 outputs single output rotational speed ORS.

The storing section 13 stores target rotational speeds of the motors 10. The number of stored target rotational speeds changes according to the number of the motors 10 included in the motor device 1. The storing section 13 is configured by a nonvolatile storage device such as a hard disk or a flash memory. The output control section 12 reads the target rotational speeds of the motors 10 from the storing section 13. Data stored in the storing section 13 may not be the target rotational speeds themselves of the motors 10 and may be calculated values calculated based on the target rotational speeds. However, by storing the target rotational speeds themselves as the data in the storing section 13 as in this configuration, it is possible to simplify work for causing the storing section 13 to store the data. With this configuration, even when the number of the motors 10 included in the motor device 1 is large, the target rotational speeds of the motors 10 can be centrally managed. Therefore, a processing load of the output control section 12 can be reduced.

FIG. 2 is a schematic diagram showing a data example stored in the storing section 13 according to the embodiment of the present disclosure. In this embodiment, as shown in FIG. 2, the storing section 13 stores first target rotational speed TRS1 and second target rotational speed TRS2. The first target rotational speed TRS1 is target rotational speed of the first motor 10*a*. The second target rotational speed TRS2 is target rotational speed of the second motor 10*b*. In FIG. 2, as an example, a unit of the first target rotational speed TRS1 and the second target rotational speed TRS2 is rpm (rotations per minute).

In the motors 10, the target rotational speeds change according to the magnitude of a driving voltage. Therefore, in the motors 10, a target rotational speed is decided for each duty ratio (Duty), which is a control value for controlling the magnitude of the driving voltage. In this embodiment, performance is different in the first motor 10*a* and the second motor 10*b*. In detail, when compared at the same duty ratio, the first motor 10*a* rotates at higher speed than the second motor 10*b*. At the same duty ratio, the first target rotational speed TRS1 is larger than the second target rotational speed TRS2.

The output control section 12 multiplies at least one input motor rotational speed by a coefficient derived based on the target rotational speeds of the motors 10 to calculate a conversion value and determines the output rotational speed ORS. In this embodiment, the output control section 12 multiplies one of the input first motor rotational speed MRS1 and the input second motor rotational speed MRS2 by a coefficient derived based on the target rotational speeds TRS1 and TRS2 of the motors 10*a* and 10*b* to calculate a conversion value and determines the output rotational speed ORS. The output control section 12 reads out the first target rotational speed TRS1 and the second target rotational speed TRS2 from the storing section 13.

Consequently, it is possible to unify, according to conversion processing performed by the output control section 12, a standard for determining propriety of motor rotational speeds between at least two motors 10 having different target rotational speeds. Therefore, even if not all of motor rotational speeds detected by the detecting sections 11 are output to the outside, it is possible to detect presence of the motor 10 having inappropriate motor rotational speed in the motor device 1. That is, it is possible to reduce the number of output terminals for outputting rotational speed of the motor device 1.

Figure 3:
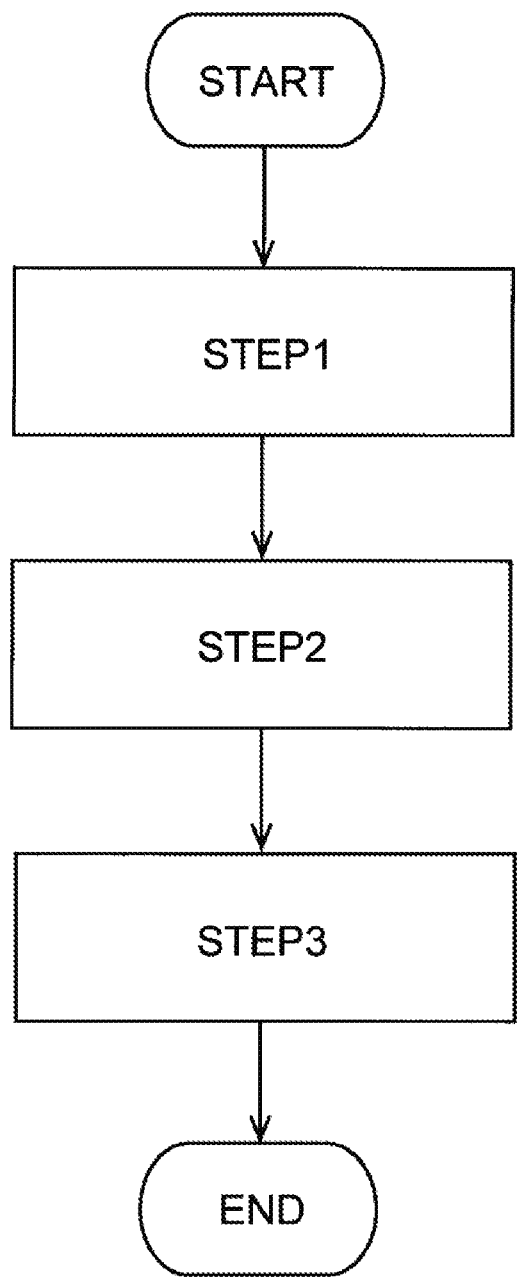
FIG. 3 is a flowchart showing a determination flow of output rotational speed according to an illustrative embodiment of the present disclosure.

FIG. 3 is a flowchart showing a determination flow of the output rotational speed ORS according to the embodiment of the present disclosure. Motor rotational speeds are input to the output control section 12 from the detecting sections 11 (STEP 1). The detecting sections 11 desirably input the motor rotational speeds to the output control section 12 at an interval of a predetermined time. Consequently, it is possible to monitor motor rotational speeds of the plurality of motors 10 at the interval of the predetermined time. In this embodiment, as explained above, the first motor rotational speed MRS1 and the second motor rotational speed MRS2 are input to the output control section 12 at the predetermined time interval.

Subsequently, the output control section 12 calculates a conversion value (STEP 2). In this embodiment, the output control section 12 calculates conversion values for the motor rotational speeds of all the motors 10 excluding a reference motor serving as a reference among the plurality of motors 10. Consequently, it is unnecessary to calculate a conversion value for the reference motor. Therefore, it is possible to reduce a processing load of the output control section 12.

In this embodiment, one of the first motor 10*a* and the second motor 10*b* is set as the reference motor. In the following explanation, it is assumed that the first motor 10*a* is the reference motor. However, the second motor 10*b* may be the reference motor. When the number of the motors 10 included in the motor device 1 is three or more, the number of reference motors may be single or may be plural. For example, when there are a plurality of motors 10 having the same target rotational speed, the plurality of motors 10 may be set as the reference motors.

Since the first motor 10*a* is the reference motor, a conversion value is not calculated for the first motor rotational speed MRS1. On the other hand, since the second motor 10*b* is not the reference motor, the second motor rotational speed MRS2 is converted using a coefficient derived based on the second target rotational speed TRS2.

In this embodiment, the coefficient is a quotient of reference a target rotational speed, which is the target rotational speed of the reference motor, divided by a target rotational speed of the motor 10. Consequently, it is possible to unify a standard for determining propriety of rotational speeds among the plurality of motors 10. The coefficient is individually derived for the motors 10 other than the reference motor. The coefficient is sometimes "1" if the motor 10, the target rotational speed of which is the same as the reference target rotational speed, is present other than the reference motor. When the coefficient is "1", it is desirable not to calculate a conversion value.

In this embodiment, the first motor 10a is the reference motor and the first target rotational speed TRS1 is the reference rotational speed. That is, a conversion value is calculated for the second motor rotational speed MRS2. A coefficient for calculating the conversion value is a quotient of the first target rotational speed TRS1 divided by the second target rotational speed TRS2.

When the target rotational speeds of the motors 10a and 10b are configured as shown in FIG. 2 and the two motors 10a and 10b are driven at a duty ratio of 20%, the coefficient multiplied with the second motor rotational speed MRS2 is 2 (=2000/1000). For example, when the second motor rotational speed MRS2 is 800 rpm, the conversion value is 1600 (=800×2) rpm.

After calculating the conversion value, the output control section 12 determines the output rotational speed ORS based on at least one conversion value and motor rotational speed of the reference motor (STEP 3). Consequently, it is possible to compare rotational speeds of the plurality of motors 10 in a state in which the standard for determining propriety of rotational speeds is unified. Therefore, even if motor rotational speeds of the motors 10 are not individually output to the outside, it is possible to detect, on the outside, presence of the motor 10 having inappropriate motor rotational speed. In this embodiment, the conversion value of the second motor rotational speed MRS2 and the first motor rotational speed MRS1 are compared. One of the conversion value of the second motor rotational speed MRS2 and the first motor rotational speed MRS1 is determined as the output rotational speed ORS.

For example, the output control section 12 determines the smallest value of the at least one conversion value and the motor rotational speed of the reference motor as the output rotational speed ORS. When all the conversion values and the motor rotational speed of the reference motor are the same value, the same value is the smallest value. With this configuration, it is possible to detect, with the single rotational speed information output from the output control section 12, presence of the motor 10 having motor rotational speed lower than a lower limit value in the motor device 1. For example, when the motor device 1 is mounted on a blowing device for cooling, it is important to detect the presence of the motor 10 having the motor rotational speed lower than the lower limit value. This configuration can be used for, for example, the blowing device for cooling.

It is assumed that the first motor 10a and the second motor 10b are driven at a duty ratio of 20%, the first motor rotational speed MRS1 is 1800 rpm, and the second motor rotational speed MRS2 is 800 rpm. When the target rotational speeds of the motors 10a and 10b are configured as shown in FIG. 2, the output control section 12 compares 1600 rpm (=800×2000/1000), which is the conversion value of the second motor rotational speed MRS2, and 1800 rpm, which is the motor rotational speed of the reference motor. The output control section 12 determines 1600 rpm, which is a smaller value of the 1600 rpm and 1800 rpm, as the output rotational speed ORS and outputs 1600 rpm to an external apparatus.

For example, the external apparatus determines a threshold based on the first target rotational speed TRS1 (=2000 rpm), which is the reference target rotational speed, and detects a rotation abnormality when the output rotational speed ORS is equal to or smaller than the threshold. When the threshold is set to, for example, 80% of the reference target rotational speed, the external apparatus detects a rotation abnormality because the output rotational speed ORS (=1600 rpm) is equal to or smaller than the threshold (=1600 rpm).

As another example, the output control section 12 determines the largest value of the at least one conversion value and the motor rotational speed of the reference motor as the output rotational speed ORS. When all the conversion values and the motor rotational speed of the reference motor are the same value, the same value is the largest value. With this configuration, it is possible to detect, with the single rotational speed information output from the output control section 12, presence of the motor 10 having motor rotational speed exceeding an upper limit value in the motor device 1. For example, when it is desired to reduce power consumption of the motor 10 or reduce noise generated from the motor 10, it is important to detect the presence of the motor 10 having the motor rotational speed exceeding the upper limit value. This configuration can be used, for example, when it is desired to reduce power consumption or noise.

It is assumed that the first motor 10a and the second motor 10b are driven at a duty ratio of 20%, the first motor rotational speed MRS1 is 2200 rpm, and the second motor rotational speed MRS2 is 1200 rpm. When the target rotational speeds of the motors 10a and 10b are configured as shown in FIG. 2, the output control section 12 compares 2400 rpm (=1200×2000/1000), which is the conversion value of the second motor rotational speed MRS2, and 2200 rpm, which is the motor rotational speed of the reference motor. The output control section 12 determines 2400 rpm, which is a larger value of 2400 rpm and 2200 rpm, as the output rotational speed ORS and outputs 2400 rpm to the external apparatus.

For example, the external apparatus determines a threshold based on the first target rotational speed TRS1 (=2000 rpm), which is the reference target rotational speed, and detects a rotation abnormality when the output rotational speed ORS is equal to or larger than the threshold. When the threshold is set to, for example, 120% of the reference target rotational speed, the external apparatus detects a rotation abnormality because the output rotational speed ORS (=2400 rpm) is equal to or larger than the threshold (=2400 rpm).

FIG. 4 is a schematic sectional view of the blowing device 2 according to the embodiment of the present disclosure taken along a plane including the center axis C. The blowing device 2 includes the motor device 1 explained above. That is, the blowing device 2 includes the first motor 10a and the second motor 10b.

The first motor 10a includes a first stationary section 101a and a first rotating section 102a. The first stationary section 101a includes a first stator 1011a including a plurality of first coils 1013a and a first circuit board 1012a. The first stator 1011a has an annular shape centering on the center axis C. The first circuit board 1012a is disposed on the lower side of the first stator 1011a. The first detecting section 11a and the output control section 12 are disposed on the first circuit board 1012a.

The first rotating section 102a includes a first shaft 1021a and a first rotor holder 1022a including a first magnet 1023a. The first shaft 1021a extends in the axial direction centering on the center axis C. The first shaft 1021a is rotatably supported by a first bearing 1014a included in the first stationary section 101a. The first rotor holder 1022a having a cut shape is fixed to the upper side of the first shaft 1021a with an opening directed downward. The first rotor holder 1022a rotates together with the first shaft 1021a. The first magnet 1023a disposed on the inner side of the first rotor holder 1022a is located on the radial direction outer side of the first stator 1011a.

A driving current is supplied to the first stator 1011a, whereby rotational torque is generated between the first magnet 1023a and the first stator 1011a. Consequently, the first rotor holder 1022a rotates with respect to the first stator 1011a together with the first shaft 1021a. The first motor 10a is a motor of an outer rotor type. However, this is illustration. The first motor 10a may be a motor of an inner rotor type.

The second motor 10b includes a second stationary section 101b and a second rotating section 102b. The second stationary section 101b includes a second stator 1011b including a plurality of second coils 1013b and a second circuit board 1012b. The second stator 1011b has an annular shape centering on the center axis C. The second circuit board 1012b is disposed on the upper side of the second stator 1011b. The second detecting section 11b is disposed on the second circuit board 1012b. The output control section 12 may be disposed on the second circuit board 1012b instead of the first circuit board 1012a.

The second rotating section 102b includes a second shaft 1021b and a second rotor holder 1022b including a second magnet 1023b. The second shaft 1021b extends in the axial direction centering on the center axis C. The second shaft 1021b is rotatably supported by a second bearing 1014b included in the second stationary section 101b. The second rotor holder 1022b having a cut shape is fixed to the lower side of the second shaft 1021b with an opening directed upward. The second rotor holder 1022b rotates together with the second shaft 1021b. The second magnet 1023b disposed on the inner side of the second rotor holder 1022b is located on the radial direction outer side of the second stator 1011b.

A driving current is supplied to the second stator 1011b, whereby rotational torque is generated between the second magnet 1023b and the second stator 1011b. Consequently, the second rotor holder 1022b rotates with respect to the second stator 1011b together with the second shaft 1021b. The second motor 10b is a motor of an outer rotor type. However, this is illustration. The second motor 10b may be a motor of an inner rotor type.

In this embodiment, the motors 10 in the motor device 1 include the first motor 10a and the second motor 10b arrayed in the axial direction. In detail, the rotation centers of the first motor 10a and the second motor 10b coincide with the center axis C. However, the rotation centers of the motors 10 may not coincide with one another. For example, the motors 10 may be arranged in such a line that the rotation centers thereof are in parallel with each other.

The blowing device 2 further includes a plurality of vanes 20 and a plurality of fans 21. The vanes 20 are attached to the motors 10a and 10b. That is, a first vane 20a is attached to the first motor 10a. In detail, the first vane 20a is attached to the first rotor holder 1022a and rotates together with the first rotor holder 1022a. A second vane 20b is attached to the second motor 10b. In detail, the second vane 20b is attached to the second rotor holder 1022b and rotates together with the second rotor holder 1022b.

The fans 21 include the motors 10 and the vanes 20. The blowing device 2 includes a first fan 21a including the first motor 10a and the first vane 20a. The blowing device 2 includes a second fan 21b including the second motor 10b and the second vane 20b. Besides, the blowing device 2 includes a tubular first housing 22a surrounding the outer circumference of the first fan 21a and a tubular second housing 22b surrounding the outer circumference of the second fan 21b.

With this configuration, in the blowing device 2 including the fans 21, rotational speeds of the fans 21 can be compared by unifying a standard for determining propriety of rotational speeds among the fans having different target rotational speeds. Therefore, even if not all of rotational speeds of the fans 21 are output to the outside, it is possible to detect presence of the fan 21 having inappropriate rotational speed in the blowing device 2.

The blowing device 2 in this embodiment is a blowing device of a so-called double reversal type. In the blowing device 2, the first fan 21a and the second fan 21b rotate in reverse directions each other, whereby the air is taken in from the upper side and delivered to the lower side to generate a flow of the air in the axial direction. That is, the plurality of fans 21 include an intake side fan 21a including the first motor 10a and an exhaust side fan 21b including the second motor 10b.

The blowing device 2 is not limited to the blowing device of the double reversal type. For example, the blowing device 2 may be a blowing device of a so-called tandem type in which the first fan 21a and the second fan 21b rotate in the same direction. The blowing device 2 may have a configuration in which the fans 21 are not disposed side by side in the axial direction. The number of the fans 21 included in the blowing device 2 may be three or more. For example, the blowing device 2 may have a configuration in which the fans 21 are disposed side by side in a direction orthogonal to the axial direction or a configuration in which a plurality of sets of the fans 21 disposed in series in the axial direction are provided in parallel.

In this embodiment, the output control section 12 compares the motor rotational speed MRS1 of the first motor 10a and a conversion value. The output control section 12 determines a smaller value as the output rotational speed ORS, or when the motor rotational speed MRS1 and the conversion value are the same value, determines the same value as the output rotational speed ORS. The conversion value is a value calculated by multiplying the motor rotational speed MRS2 of the second motor 10b by a quotient of the target rotational speed TRS1 of the first motor 10a divided by the target rotational speed TRS2 of the second motor 10b.

According to this embodiment, when a blowing characteristic of at least one of the intake side fan 21a and the exhaust side fan 21b is lower than a predetermined blowing characteristic, it is possible to detect to that effect with the single rotational speed information output from the output control section 12. According to this embodiment, since the blowing device 2 is configured to output the single rotational speed information, the number of terminals for receiving rotational speed information can be reduced to one in the external apparatus that receives the rotational speed information.

Figure 5:
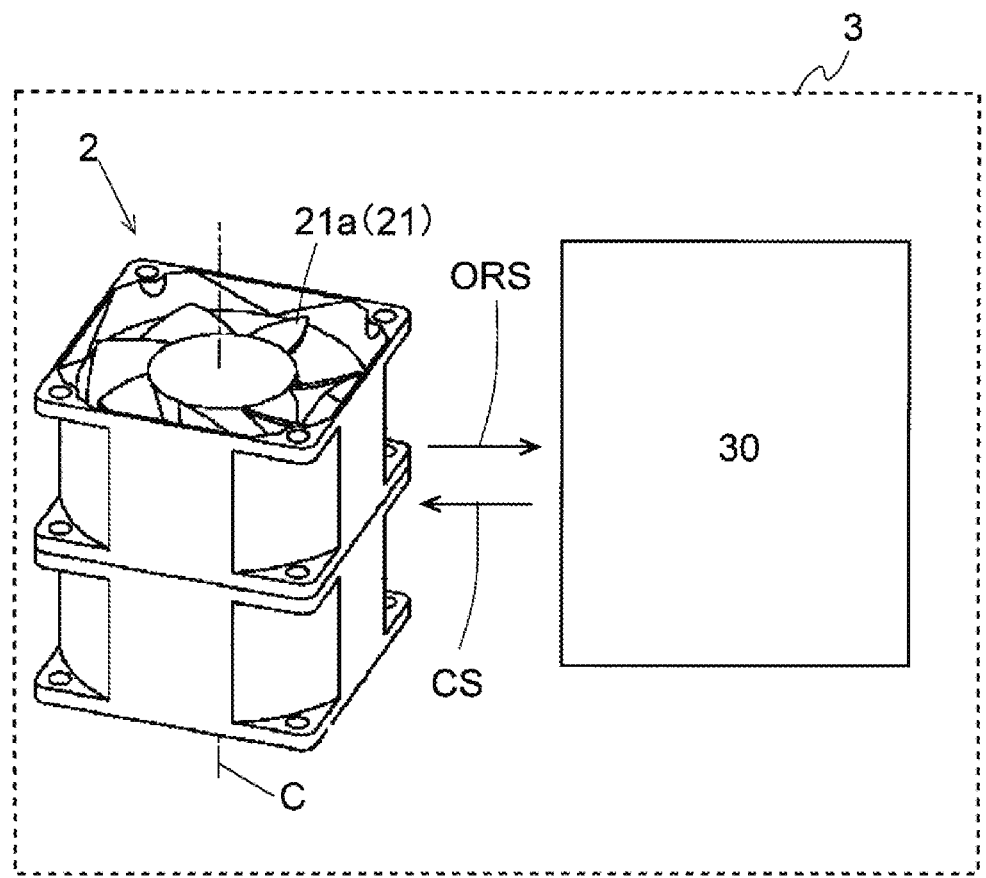
FIG. 5 is a schematic diagram showing the configuration of a server device according to an illustrative embodiment of the present disclosure.

FIG. 5 is a schematic diagram showing the configuration of a server device 3 according to the embodiment of the present disclosure. As shown in FIG. 5, the server device 3 includes the blowing device 2 and a server control section 30. The blowing device 2 is a cooling device that cools the server device 3 itself or the periphery of the server device 3. In this embodiment, the blowing device 2 includes the motor device 1 and the plurality of fans 21.

The server control section 30 controls the entire server device 3. In this embodiment, the server control section 30 controls the operation of the blowing device 2. The server control section 30 outputs a control signal CS to the motor device 1 of the blowing device 2. In this embodiment, the plurality of motors 10 are driven by a single control signal CS input from the outside. Therefore, the number of terminals for outputting the control signal CS of the server device 3 can be reduced to one. In other words, with this configuration, it is possible to reduce the number of terminals for inputting signals to the motor device 1. However, the control signal CS may be output from the server device 3 to the motors 10.

The blowing device 2 outputs the output rotational speed ORS to the server control section 30. The server control section 30 detects an abnormality of rotation when the output rotational speed ORS is lower than a predetermined threshold. The predetermined threshold is determined based on, for example, the reference target rotational speed explained above. For example, the predetermined threshold is set to a numerical value lower than the reference target rotational speed by 20%. When detecting an abnormality of rotation, for example, the server control section 30 informs the abnormality to the outside. A method of informing the abnormality of the rotation may be, for example, display on a monitor or an output of alarm sound.

In this embodiment, although the blowing device 2 includes the plurality of fans 21, the server control section 30 can detect, with the single output rotational speed input from the motor device 1, the presence of a fan having a rotation abnormality among the plurality of fans 21. In this embodiment, the number of input terminals for inputting rotational speed information in the server device 3 can be reduced to one. When the server device 3 includes three or more fans, providing at least two fans with the configuration explained above enables reduction in the number of input terminals for inputting rotational speed information in the server device 3.

The output control section 12 of a motor device 1A in a first modification calculates conversion values for all input motor rotational speeds and determines the output rotational speed ORS based on a plurality of conversion values. With such a configuration as well, it is possible to unify a standard for determining propriety of motor rotational speeds between at least two motors 10 having different target rotational speed.

In this modification, the coefficient is the inverse of the target rotational speed of the motor 10. Consequently, it is possible to reduce the size of data output from the output control section 12. An arithmetic operation in calculating the coefficient can be simplified. An example is explained in which the motor device 1A includes two motors, that is, the first motor 10a and the second motor 10b. However, the configuration of the first modification can also be applied when the motor device 1 includes three or more motors.

It is assumed that the first motor 10a and the second motor 10b are driven at a duty ratio of 20%. When the target rotational speeds of the motor 10a and 10b are configured as shown in FIG. 2, the output control section 12 calculates the coefficient of the first motor rotational speed MRS1 as 0.0005 (=1/2000) and calculates the coefficient of the second motor rotational speed MRS2 as 0.001 (=1/1000). With this configuration, the inverses of the target rotational speeds in the first motor 10a and the second motor 10b are the coefficients. Therefore, an arithmetic operation in calculating the coefficients can be simplified.

It is assumed that the first motor 10a and the second motor 10b are driven at a duty ratio of 20%, the first motor rotational speed MRS1 is 1800 rpm, and the second motor rotational speed MRS2 is 800 rpm. When the target rotational speeds of the motors 10a and 10b are configured as shown in FIG. 2, the output control section 12 compares 0.9 (=1800/2000), which is a conversion value of the first motor rotational speed MRS1, and 0.8 (=800/1000), which is a conversion value of the second motor rotational speed MRS2, and determines the output rotational speed ORS.

The output control section 12 determines the smallest value among all the conversion values as the output rotational speed ORS. Consequently, with the single rotational speed information output from the output control section 12, it is possible to detect presence of a motor having rotational speed lower than a lower limit value in the motor device 1A. In the specific example explained above, a smaller conversion value (=0.8) of the conversion value (=0.9) of the first motor rotational speed MRS1 and the conversion value (=0.8) of the second motor rotational speed MRS2 is output as the output rotational speed ORS. The motor device 1A in the first modification may be included in the blowing device 2 or the server device 3 instead of the motor device 1.

A motor device 1B in a second modification has substantially the same configuration as the configuration of the motor device 1A in the first modification. However, the output control section 12 determines the largest value among all the conversion values as the output rotational speed ORS. The motor device 1B in the second modification is different from the motor device 1A in the first modification in this point. Consequently, with the single rotational speed information output from the output control section 12, it is possible to detect presence of a motor having rotational speed exceeding an upper limit value in the motor device 1B. The motor device 1B in the second modification may be included in the blowing device 2 or the server device 3 instead of the motor device 1.

In a motor device 1C in a third modification, as in the first modification, the output control section 12 calculates conversion values for all input motor rotational speeds and determines the output rotational speed ORS based on a plurality of conversion values. The output control section 12 determines the smallest value among all the conversion values as the output rotational speed ORS. However, the motor device 1C is different from the motor device 1A in the first modification in a coefficient derived based on the target rotational speed of the motor 10.

Provided that a ratio of the target rotational speed of the first motor 10a and the target rotational speed of the second motor 10b is X:Y, the output control section 12 of the motor device 1C compares two conversion values, one of which is calculated by multiplying the motor rotational speed of the first motor 10a by Y, and the other of which is calculated by multiplying the motor rotational speed of the second motor 10b by X and determines a smaller value as the output rotational speed ORS, or when both the conversion values are the same value, determines the same value as the output rotational speed ORS.

A specific example is explained. It is assumed that the first motor 10a and the second motor 10b are driven at a duty ratio of 20%, the first motor rotational speed MRS1 is 1800 rpm, and the second motor rotational speed MRS2 is 800 rpm. When the target rotational speeds of the motors 10a and 10b are configured as shown in FIG. 2, a ratio of the first target rotational speed TRS1 and the second target rotational speed TRS2 is 2:1 (=2000:1000). That is, X=2 and Y=1.

The output control section 12 multiplies the first motor rotational speed MRS1 by 1 (=Y) to calculate a conversion value 1800 rpm. When the coefficient is "1", processing for calculating conversion values may be omitted. The output control section 12 multiplies the second motor rotational speed MRS2 by 2 (=X) to calculate a conversion value 1600 rpm. The output control section 12 determines 1600 rpm, which is a smaller conversion value of the conversion values 1600 rpm and 1800 rpm, as the output rotational speed ORS and outputs 1600 rpm to the external apparatus.

The motor device 1C in the third modification may be included in the blowing device 2 or the server device 3 instead of the motor device 1. When the motor device 1C is included in the blowing device 2 and a blowing characteristic of at least one of the intake side fan 21*a* and the exhaust side fan 21*b* is lower than a predetermined blowing characteristic, it is possible to detect to that effect with the single rotational speed information output from the output control section 12.

The present disclosure can be used for an electronic device such as a server device including a blowing device. The present disclosure can be used for a blowing device that supplies an air flow for cooling into a room such as a server room in which a plurality of electronic devices are disposed.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A motor device comprising:
a plurality of motors;
a plurality of detectors provided in the respective motors to detect motor rotational speeds; and
an output controller configured or programmed to output a single output rotational speed based on the motor rotational speeds input from the plurality of detectors; wherein
the output controller multiplies at least one of the input motor rotational speeds by a coefficient derived based on target rotational speeds of the motors to calculate a conversion value, and determines the output rotational speed.

2. The motor device according to claim 1, wherein the output controller calculates a plurality of the conversion values for the motor rotational speeds of all the motors excluding a reference motor serving as a reference motor among the plurality of motors and determines the output rotational speed based on at least one of the conversion values and the motor rotational speed of the reference motor.

3. The motor device according to claim 2, wherein the output controller determines a smallest value among the at least one conversion value and the motor rotational speed of the reference motor as the output rotational speed.

4. The motor device according to claim 2, wherein the output controller determines a largest value among the at least one conversion value and the motor rotational speed of the reference motor as the output rotational speed.

5. The motor device according to claim 1, wherein the coefficient is a quotient of a reference target rotational speed, which is the target rotational speed of the reference motor, divided by the target rotational speed of the motor.

6. The motor device according to claim 1, wherein the output controller calculates a plurality of the conversion values for all the input motor rotational speeds and determines the output rotational speed based on the plurality of conversion values.

7. The motor device according to claim 6, wherein the output controller determines a smallest value among all the conversion values as the output rotational speed.

8. The motor device according to claim 6, wherein the output controller determines a largest value among all the conversion values as the output rotational speed.

9. The motor device according to claim 1, wherein the coefficient is an inverse of the target rotational speed of the motor.

10. The motor device according to claim 1, further comprising a storage to store the target rotational speeds of the motors, wherein
the output controller reads the target rotational speeds of the motors from the storage.

11. The motor device according to claim 1, wherein the plurality of motors are driven by a single control signal input from an outside.

12. A blowing device comprising:
the motor device according to claim 1;
a plurality of vanes attached to the respective motors; and
a plurality of fans including the motors and the vanes.

13. The blowing device according to claim 12, wherein
the plurality of motors include a first motor and a second motor arrayed in an axial direction;
the plurality of fans include an intake side fan including the first motor and an exhaust side fan including the second motor; and
the output controller compares the motor rotational speed of the first motor and the conversion value calculated by multiplying the motor rotational speed of the second motor by a quotient of the target rotational speed of the first motor divided by the target rotational speed of the second motor, and determines a smaller value as the output rotational speed, or when the motor rotational speed of the first motor and the conversion value are the same value, determines the same value as the output rotational speed.

14. The blowing device according to claim 12, wherein
the plurality of motors include a first motor and a second motor arrayed in an axial direction;
the plurality of fans include an intake side fan including the first motor and an exhaust side fan including the second motor; and
provided that a ratio of the target rotational speed of the first motor and the target rotational speed of the second motor is X:Y, the output controller compares the two conversion values, one of which is calculated by multiplying the motor rotational speed of the first motor by Y, and the other of which is calculated by multiplying the motor rotational speed of the second motor by X, and determines a smaller value as the output rotational speed, or when both of the conversion values are the same value, determines the same value as the output rotational speed.

15. A server device comprising:
the blowing device according to claim 12; and
a server controller configured or programmed to detect an abnormality of rotation when the output rotational speed is lower than a predetermined threshold.

* * * * *